United States Patent [19]

Maggelet

[11] Patent Number: 4,956,750
[45] Date of Patent: Sep. 11, 1990

[54] REGISTER RACK ASSEMBLY FOR A PROGRAMMABLE CONTROLLER SYSTEM

[75] Inventor: John Maggelet, Sussex, Wis.

[73] Assignee: Square D Company, Palatine, Ill.

[21] Appl. No.: 325,414

[22] Filed: Mar. 17, 1989

[51] Int. Cl.⁵ .............................................. H05K 7/14
[52] U.S. Cl. ..................................... 361/415; 361/383; 361/391; 361/417; 361/419
[58] Field of Search ............... 361/383, 391, 393, 394, 361/415, 417, 419, 420, 427, 428

[56] References Cited

U.S. PATENT DOCUMENTS

| | | | |
|---|---|---|---|
| 4,628,413 | 12/1986 | Sperau | 361/394 |
| 4,672,511 | 6/1987 | Meusel et al. | 361/415 |
| 4,731,702 | 3/1988 | Hiatt et al. | 361/395 |

*Primary Examiner*—Gregory D. Thompson
*Attorney, Agent, or Firm*—Michael J. Femal; Thomas K. Stine

[57] ABSTRACT

A register rack assembly for housing a plurality of electronic modules including a programmable controller and related devices, each of the modules containing an electronic circuit board, is disclosed.

9 Claims, 6 Drawing Sheets

FIG. 13

REGISTER RACK ASSEMBLY FOR A PROGRAMMABLE CONTROLLER SYSTEM

TECHNICAL FIELD

The present invention relates generally to programmable controllers and more particularly to a register rack assembly for mounting a programmable controller and related devices in a manufacturing plant.

BACKGROUND ART

Programmable controllers have been used for a number of years for controlling various operations in a manufacturing plant. Typically, a programmable controller includes a controller module and a plurality of related modules, for example, I/O modules, communication modules and the like. The modules are interconnected in a cell to perform various functions such as relay logic, counting, timing, and data manipulation.

Because the modules are typically located in proximity of the equipment they are controlling, they are of necessity located on the plant floor.

A plant floor environment can be very precarious to the electronic modules, so they must be housed in a support mechanism of sturdy construction to absorb the abuse that such plant environments present.

In addition, regardless of the nature of the housing, the nature of electronics in a plant environment will invariably result in module failure. Because module failure can result in equipment shut-down, the housing must be configured so that the modules can be quickly replaced.

Further, prior housings required fans to provide cooling for the modules. In addition, because the fans typically moved relatively large quantities of air over the modules, and the air is typically dusty, air filters have been incorporated to first clean the air. These air filters are a constant maintenance item, and failure of the fan can result in overheating and failure of its related electronic modules.

This invention is provided to solve these and other problems.

SUMMARY OF THE INVENTION

It is an object of the invention to provide a register rack assembly for housing a plurality of electronic modules including a programmable controller and related devices, each of the electronic modules containing an electronic circuit board.

According to the invention, the register rack assembly comprises a rear wall, a pair of spaced side walls and a top wall.

The register rack assembly further includes a mounting member extending between the side walls at a lower end of the rear wall. The mounting member has spaced tabs defining positioning slots for receiving complementary mounting tabs forming part of the electronic modules.

The register rack assembly still further includes a latch member pivotally joined to the side walls adjacent respective upper forward edges thereof and means for locking the latch member in a closed position in engagement with an abutment on the electronic modules. The latch member operates to retain the modules in the register rack assembly.

A mother board mounted on the rear wall of the register rack assembly has a plurality of circuit board receiving slots adapted for receiving respective circuit board tabs of the circuit boards contained in the electronic modules.

The latch member is generally L-shaped. The side walls have upper edges defining a generally horizontal plane and outer edges defining a generally vertical plane. The latch member has a first leg substantially parallel with the horizontal plane and a second leg substantially parallel with the vertical plane.

According to one embodiment of the invention, the latching means comprises a resilient, generally U-shaped, bracket having first and second bracket legs. The first leg is secured to the top wall and the second leg is oriented downward from the first leg and terminates with a generally arcuate portion. A roller bracket has a first portion secured to the first leg of the latch member and a second portion downwardly disposed from the roller bracket first portion. The roller bracket second portion maintains over-center contact with the arcuate portion of the U-shaped bracket second portion when the latch member is in the closed position to maintain the latch member in the closed position. The roller bracket second portion includes a roller for maintaining over-center contact with the arcuate portion of the U-shaped bracket second portion.

According to another embodiment of the invention, the latching means comprises first and second pins outwardly biased from the latch member and first and second openings in respective ones of the side walls for receiving respective ones of the first and second pins.

It is comprehended that the register rack assembly has a generally open bottom and that the top wall includes a plurality of top wall openings to cooperate with the electronic modules housed in the register rack assembly to permit upward flow of ambient air over the electronic circuit boards contained in the electronic modules. This upward flow of ambient air provides convection cooling of components on the electronic circuit boards.

It is still further comprehended that the register rack assembly comprises an extender bracket downwardly disposed from the mounting bracket. The extender bracket is adapted for supporting bottom portions of the electronic modules extending below the rear wall.

Thus, an electronic module can easily be installed into the register rack assembly by moving the latch member to an open position, and positioning the module so that a module tab is located in a slot on the mounting member. The tab is then secured to the mounting member by a single fastener. The latch member is then moved to a locked position and engages an abutment on the module housing to lock the module in a fixed position in the register rack assembly.

Other features and advantages of the invention will be apparent from the following specification taken in conjunction with the following drawings.

DETAILED DESCRIPTION

While this invention is susceptible of embodiment in many different forms, there is shown in the drawings and will herein be described in detail a preferred embodiment of the invention with the understanding that the present disclosure is to be considered as an exemplification of the principles of the invention and is not intended to limit the broad aspect of the invention to embodiment illustrated.

This application is related to commonly assigned, co-pending application to Russell, Ser. No. 07/325 411 the specification of which is expressly incorporated by reference.

Figure 1:
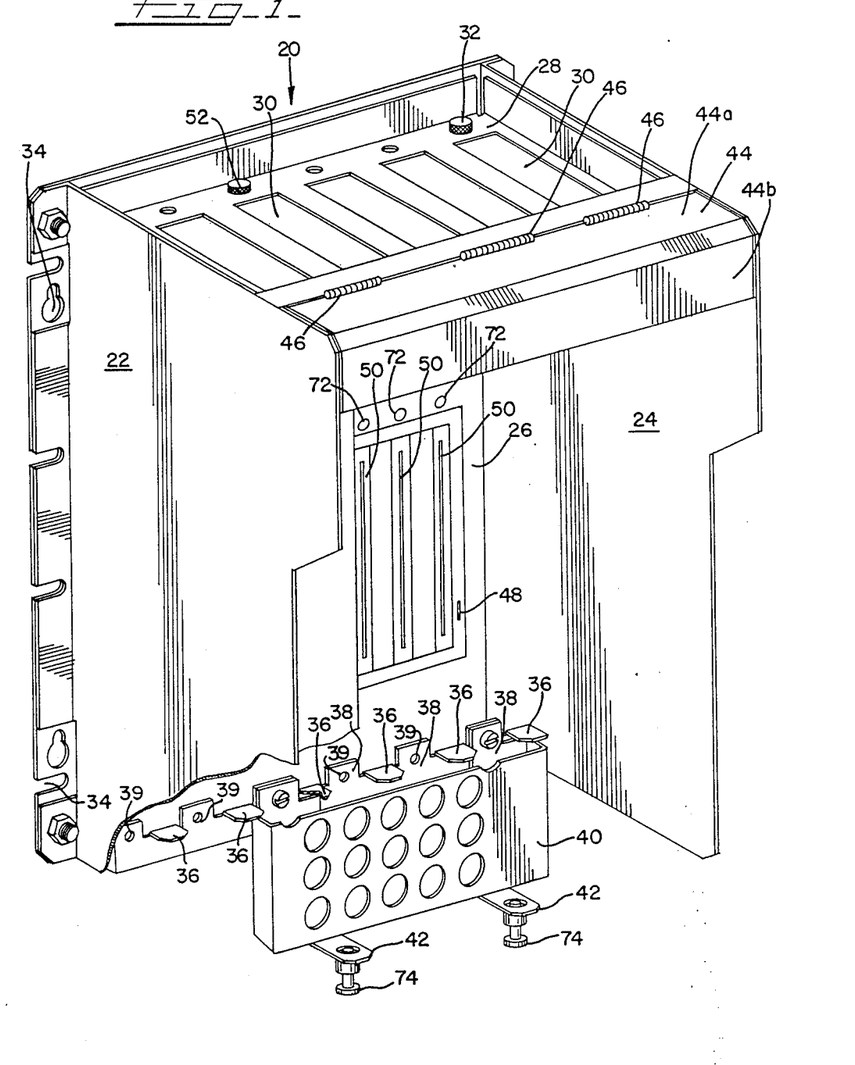
FIG. 1 is a perspective view of a register rack assembly in accordance with the invention.

A register rack assembly 20 according to the invention is illustrated in FIG. 1.

The register rack assembly 20 includes first and second spaced sidewalls 22, 24, a rear wall 26 and a top wall 28. The top wall 28 includes five removable cover plates 30 retained in place by thumbscrews 32.

The side periphery of the rear wall 26 includes various cut away portions 34 for mounting the register rack assembly 20, as for example in a control panel (not shown).

Towards the lower end of the rear wall 26 are spaced tabs 36 defining positioning slots 38 therebetween. The positioning slots 38 include threaded holes 39. Extending downwardly from the spaced tabs 36 is an extender bracket 40 having forward extending support brackets 42, as discussed in greater detail below.

A latch member 44 is disposed between the first and second sidewalls 22, 24 adjacent respective upper forward edges thereof. The latch member 44 is generally L-shaped and includes a first leg 44a and a second leg 44b. The first leg 44a is pivotally joined to the top wall 28 by three hinges 46. The hinges 46 permit the latch member 44 to pivot relative to the first and second sidewalls 22, 24.

The register rack assembly 20 includes a mother board 48 having five receiving slots 50.

Figure 2:
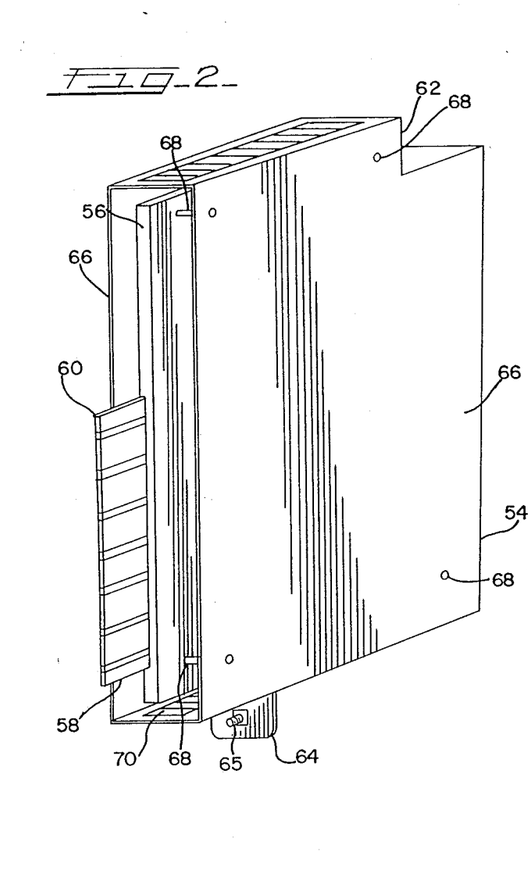
FIG. 2 is a perspective view of an electronic module for placement in the register rack assembly of FIG. 1.

An electronic module 54 of the type utilized in conjunction with the register rack assembly 20 (FIG. 1) is illustrated in FIG. 2. The electronic module 54 may be a programmable controller, an I/0 device, a cell controller, or the like.

The electronic module 54 includes a vertically oriented circuit board 56 which typically contains a plurality of interconnected electronic components. The circuit board 56 includes a tab 58 having a plurality of conductive circuit traces 60 which is plugged into one of the receiving slots 50 of the mother board 48. The circuit board 56 is supported between module sidewalls 66 by spacers 68.

The electronic module 54 further includes an exterior abutment 62 and a positioning tab 64 having a captive screw 65.

Referring to FIG. 1, the module 54 of FIG. 2 is placed in the register rack assembly 20 by first inserting the tab 58 into one of the receiving slots 50 and positioning the positioning tab 64 in the corresponding positioning slot 38 between the spaced tabs 36. The latch member 44 is then closed and latched, as discussed in greater detail below. When closed, the latch member 44 presses against the abutment 62 to retain the electronic module 54 in the register rack assembly 20. Each module 54 is further secured to the register rack assembly 20 by screwing the captive screw 65 into the threaded hole 39 of the positioning slot 38. The captive screw 65 further provides a stable chassis ground for the electronic module 54.

The cover plates 30 located above the electronic module 54 when the electronic module 54 is in place is removed. As air surrounding the circuit board 56 is heated during operation, it rises and escapes via the removed cover plates 30. Because the register rack assembly 20 has no bottom plate, ambient air enters the bottom of the electronic module 54 through a grill 70 (FIG. 2) to provide relatively cool ambient air and thereby cool the electronic module 54 without a need for cooling fans or filters.

Most electronic modules 54 fit within the register rack assembly 20 between the spaced tabs 36 and the top wall 28. However, certain electronic modules 54, such as the SY/GATE ®MiniCell Controller, distributed by Square D Company, assignee of this application, are longer, and therefore the extender bracket 40 is provided to adapt the register rack assembly 20 to such oversized electronic modules 54a.

As discussed in greater detail below, the oversized electronic module 54a is placed in the register rack assembly 20 and rests on the support brackets 42. The back of the oversized electronic module 54a includes register holes (not shown) which register with register pins 72 to properly orient the oversized electronic module 54a in the register rack assembly 20.

The support brackets 42 each include a thumb screw 74 which aligns with corresponding threaded female openings in the base of the oversized electronic module 54a to secure the oversized electronic module 54a to the extender bracket 40.

Figure 3:
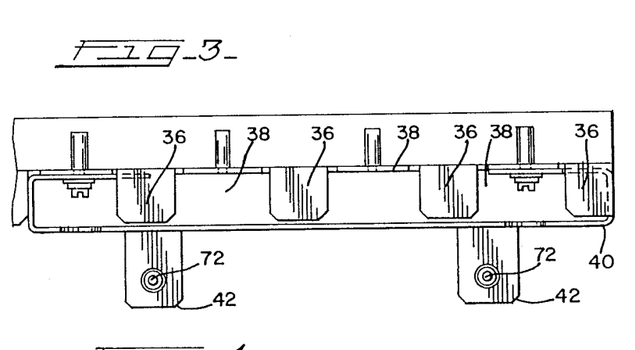
FIG. 3 is a top plan view of an extension bracket according to the invention.
Figure 4:
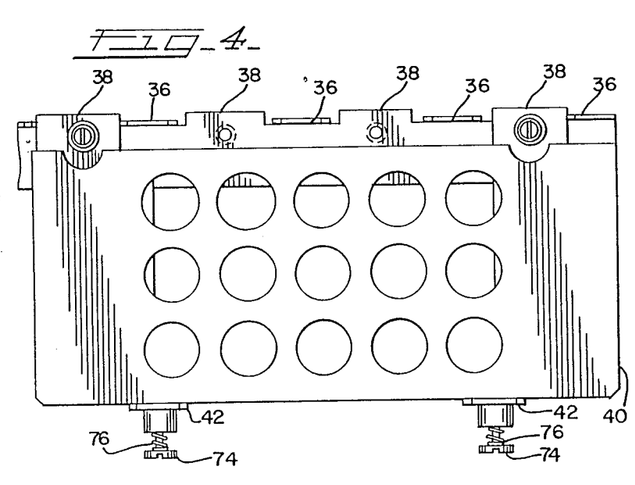
FIG. 4 is a front view of the extension bracket of FIG. 3.

The extender bracket 40 is illustrated in greater detail in FIGS. 3 and 4. As illustrated in FIG. 4, the thumbscrews 74 are secured to the support brackets 42 by springs 76 to facilitate removal of the thumbscrew 74 from the respective female threaded holes of the oversize electronic module 54a.

Figure 5:
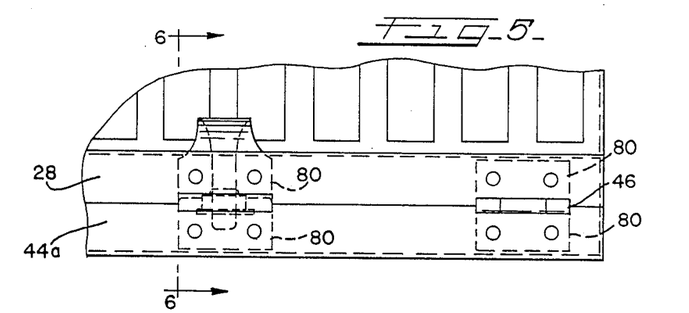
FIG. 5 is a partial top view of a first embodiment of a lock mechanism for a latch member according to the invention.
Figure 6:
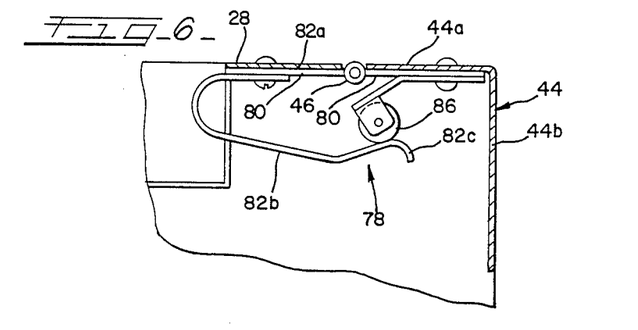
FIG. 6 is a sectional view of the first embodiment of the lock mechanism taken along line 6—6 of FIG. 5.
Figure 7:
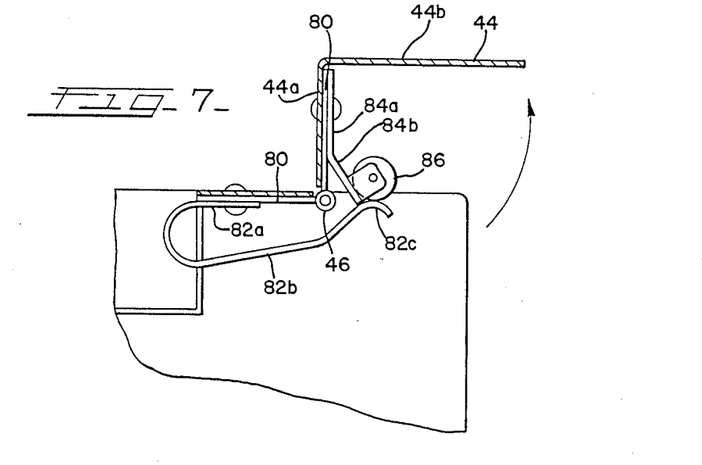
FIG. 7 is a sectional view of the first embodiment of the lock mechanism taken along line 6—6 of FIG. 5, but with the latch mechanism in the open position.

A first lock mechanism 78 for maintaining the latch member 44 in the closed position is illustrated in FIGS. 5, 6 and 7.

The hinges 46 include hinged brackets 80 secured to the underside of the first leg 44a of the latch member 44 and to the top wall 28.

As illustrated in FIG. 6, the first lock mechanism 78 includes a resilient U-shaped bracket 82 having a first leg 82a and a second leg 82b. The second leg 82b, terminates at an arcuate portion 82c. The first leg 82a is attached to the underside of the top wall 28, and the second leg 82b extends downward therefrom.

The first lock mechanism 78 further includes in roller bracket 84 having a first portion 84a secured to the first leg 44a of the latch member 44. The roller bracket 84 further has a roller portion 84b terminating with a roller 86. When in the closed position, as illustrated in FIG. 6, the roller 86 maintains an over center relation with the arcuate portion 82c of the U-shaped bracket 82.

As the latch member 44 is manually raised, as shown in FIG. 7, the roller 86 rolls over the arcuate portion 82c of the U-shaped bracket 82, moving from the overcenter position of FIG. 6 to a released position of FIG. 7. The U-shaped bracket 82 then maintains the latch member 44 in the open position, facilitating removal of the electronic modules 54.

A second lock mechanism 88, an alternate embodiment to the first lock mechanism 78 of FIGS. 5–7 is illustrated in FIGS. 8–11.

Figure 8:
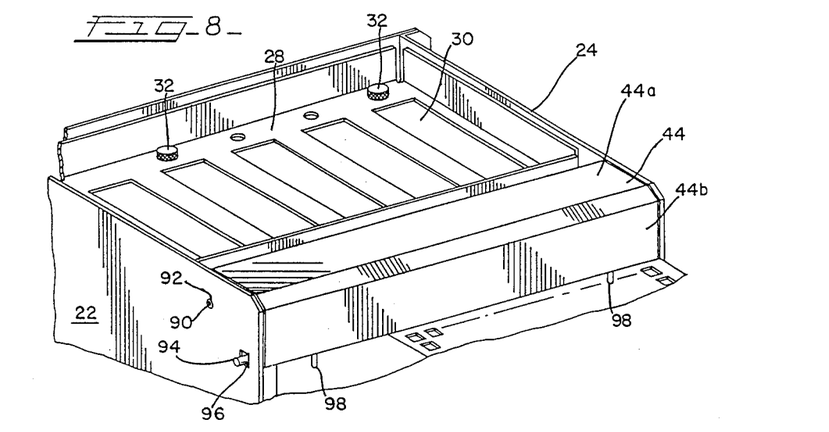
FIG. 8 is a partial perspective view of the top portion of the register rack assembly illustrating a second embodiment of the lock mechanism.

According to this arrangement, the latch member 44 is pivotally joined to the first and second sidewalls 22, 24 by means of a pivot pin 90 extending through pivot pin openings 92 in the sidewalls 22, 24. Locking pins 94 extend outwardly from each side of the second leg 44b of the latch member 44 through locking pin openings 96. Each of the locking pins 94 is outwardly biased and operable by means of respective locking pin actuators 98.

Figures 9, 10, 11:
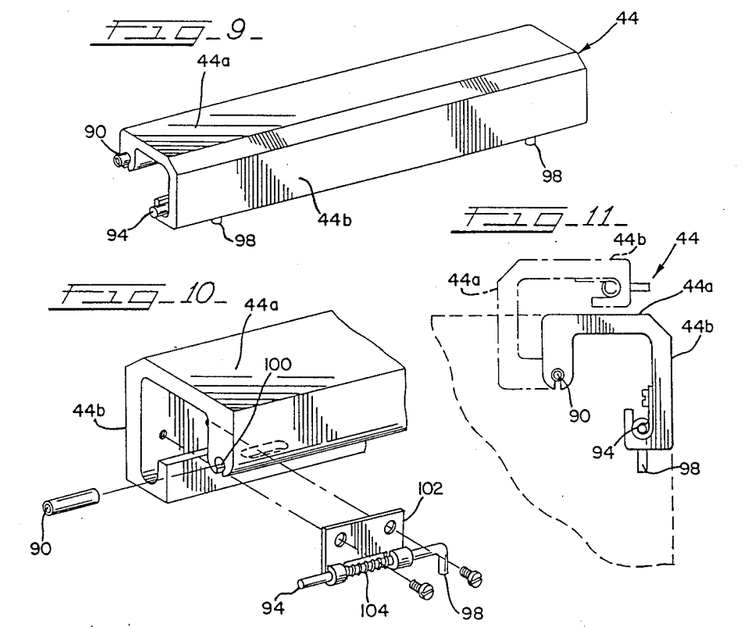
FIG. 9 is a perspective view of the lock mechanism of FIG. 8.
FIG. 10 is an exploded perspective view of the lock mechanism of FIG. 8.
FIG. 11 is a side elevation view of the latch member of, FIG. 8.

A more detailed view of the second lock mechanism 88 is illustrated in FIG. 10.

The pivot pin 90 is secured in a pivot pin retaining slot 100 by an interference fit. The locking pin 94 is integral with the locking pin actuator 98, which together are supported by a locking pin bracket 102. A locking pin spring 104 maintains the locking pin 94 outwardly biased.

The latch member 44 incorporating the second lock mechanism 88 is illustrated in FIG. 11 in both the open position and the closed position as indicated.

Figure 12:
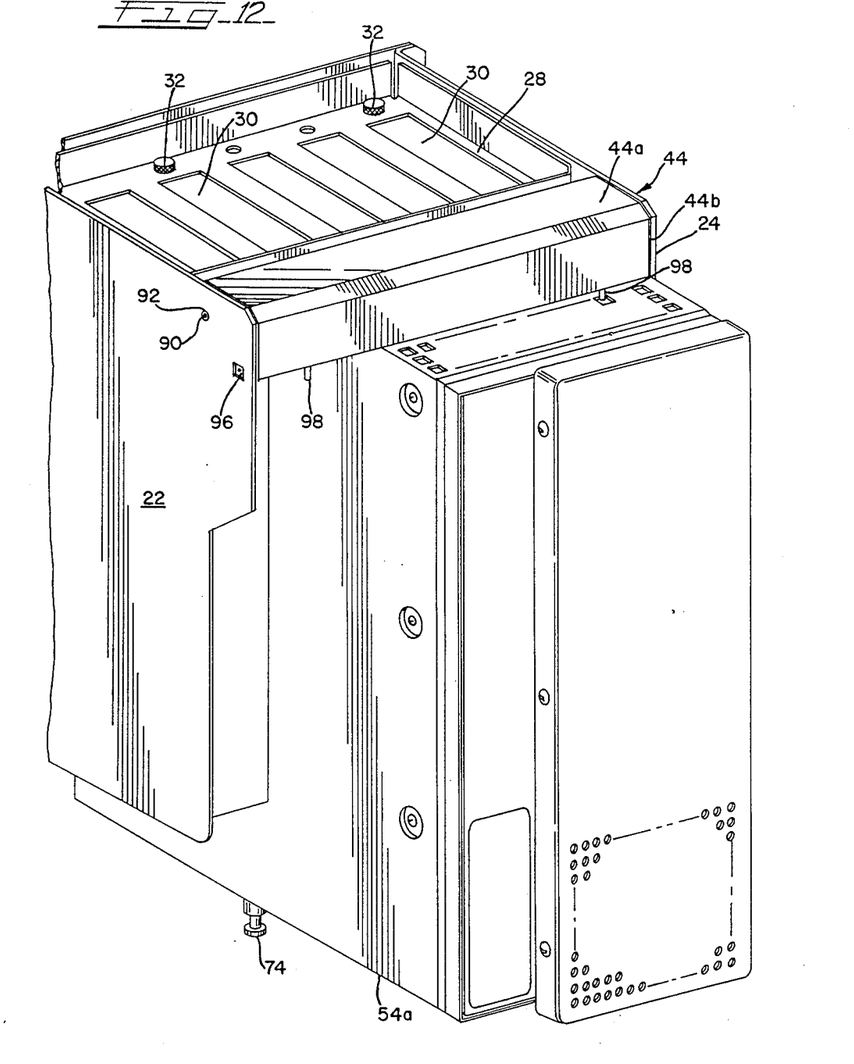
FIG. 12 is a perspective view of an oversized electronic module mounted in the register rack assembly of FIG. 1.
Figure 13:
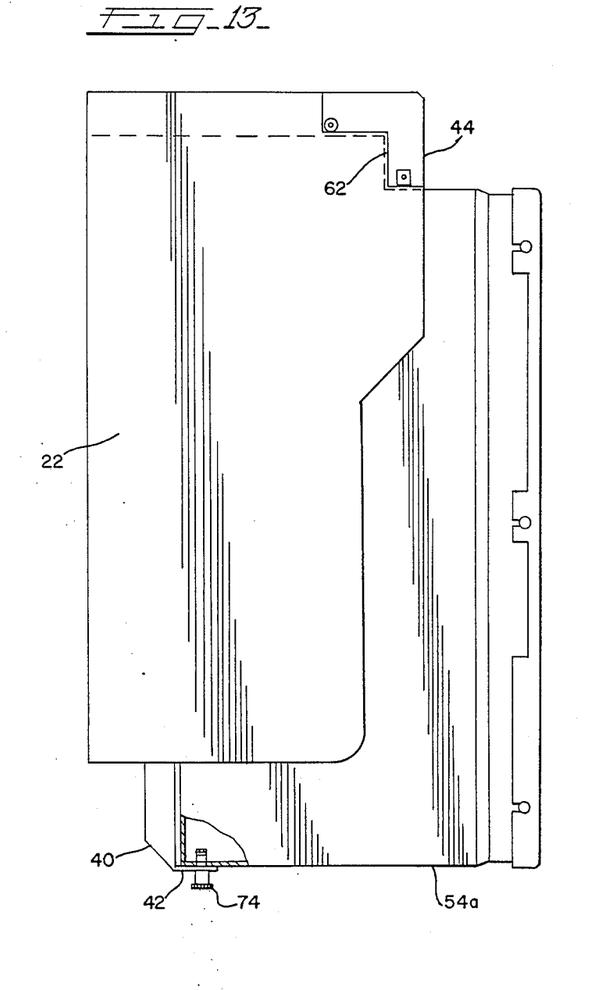
FIG. 13 is a side elevation view the oversized electronic module of FIG. 13 mounted in the register rack assembly of FIG. 1.

The oversized electronic module 54a mounted in the register rack assembly 20 is illustrated in FIGS. 12 and 13.

As illustrated in FIG. 13, the abutment 62 of the oversized electronic module 54a is held in place by the latch member 44. The bottom portion of the oversized electronic module 54a is supported by the support brackets 42 extending outwardly from the extender bracket 40.

The thumbscrew 74 is shown screwed into the base of the oversized electronic module 54a to maintain it secure to the support brackets 42.

Thus it can be seen that the above described register rack assembly 20 provides a housing for a plurality of electronic modules. The register rack assembly facilitates easy removal of the electronic modules. Further, it provides for oversized electronic modules. Finally it provides convection cooling for the electronic modules without blower fans or a filter.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

I claim:

1. A register rack assembly housing a plurality of electronic modules including a programmable controller and related devices, each of said electronic modules containing an electronic circuit board, said register rack assembly comprising:

a rear wall, a pair of spaced side walls and a top wall;

a mounting member extending between said side walls and mounted at a lower end of said rear wall, said mounting member having spaced tabs defining positioning slots for receiving a complementary mounting tab forming part of each said electronic modules;

a latch member disposed between said side walls and mounted thereto adjacent respective upper forward edges thereof, said latch member including means for pivoting said latch member relative to said side walls; and means associated with said latch member for locking said latch member in a closed position in engagement with an abutment on said electronic modules, said latch member retaining said modules in said register rack assembly.

2. The register rack assembly of claim 1 including a mother board having a plurality of circuit board receiving slots mounted on said rear wall, said receiving slots adapted for receiving a respective circuit board tab of said circuit boards contained in said electronic modules.

3. The register rack assembly of claim 1 wherein said latch member is generally L-shaped.

4. The register rack assembly of claim 3 wherein:

said side walls have upper edges defining a generally horizontal plane and forward edges defining a generally vertical plane; and said generally L-shaped latch member has a first leg substantially parallel with said horizontal plane and a second leg substantially parallel with said vertical plane.

5. The register rack assembly of claim 4 wherein said latching member comprises:

a generally U-shaped, resilient bracket having first and second bracket legs, said first leg secured to said top wall, said second leg oriented downward from said first leg and terminating with a generally arcuate portion; and a roller bracket having a first portion secured to said first leg of said L-shaped latch member and a second portion downwardly disposed from said first portion, said roller bracket second portion maintaining over-center contact with said arcuate portion of said U-shaped bracket second portion when said L-shaped latch member is in said closed position to maintain said L-shaped latch member in said closed position.

6. The register rack assembly of claim 5 wherein said roller bracket second portion includes a roller for maintaining over-center contact with said arcuate portion of said U-shaped bracket second portion.

7. The register rack assembly of claim 4 wherein said latching member comprises:

first and second pins outwardly biased from said latch member, said first and second pins received in first and second openings of said side walls, respectively.

8. The register rack assembly of claim 1 wherein said top wall includes at least one cover plate, said at least one cover plate being removable to allow relative cool ambient air to flow over said electronic circuit boards to provide cooling to said electronic circuit boards.

9. A register rack assembly housing a plurality of electronic modules including a programmable controller and related devices, each of said modules containing an electronic circuit board, said register rack comprising:
- a rear wall, a pair of spaced side walls and a top wall;
- a mounting member extending between said side walls and mounted at a lower end of said rear wall, said mounting member having spaced tabs defining positioning slots for receiving a complementary mounting tab forming part of said electronic modules;
- at least one said extender bracket downwardly disposed from said mounting member and adapted for supporting a bottom portion of a respective electronic module extending below said rear wall;
- a latch member disposed between said side walls and mounted thereto adjacent respective upper forward edges thereof, said latch member including means for pivoting said latch member relative to said side walls; and
- means associated with said latch member for locking said latch member in a closed position in engagement with an abutment on said electronic modules, said latch member retaining said modules in said register rack assembly.

* * * * *